US006724315B2

(12) United States Patent
Downer

(10) Patent No.: US 6,724,315 B2
(45) Date of Patent: Apr. 20, 2004

(54) IDENTIFICATION OF MOUNTING LOCATIONS OF SUB-SYSTEMS IN MOUNTING UNITS

(75) Inventor: Wayne A. Downer, Portland, OR (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 10/039,776

(22) Filed: Jan. 2, 2002

(65) Prior Publication Data

US 2003/0122683 A1 Jul. 3, 2003

(51) Int. Cl.⁷ .............................................. G08B 21/00
(52) U.S. Cl. ................. 340/686.1; 340/686.2; 340/686.4
(58) Field of Search ................. 340/686.1, 686.2, 340/686.4, 687, 691.1, 691.6, 517, 524, 525, 545.6, 550, 555, 556, 557

(56) References Cited

U.S. PATENT DOCUMENTS

| | | | |
|---|---|---|---|
| 4,636,634 A | * 1/1987 | Harper et al. ............ 250/223 R |
| 4,881,061 A | 11/1989 | Chambers | |
| 5,059,772 A | 10/1991 | Younglove | |
| 5,073,078 A | * 12/1991 | Merlo ......................... 414/274 |
| 5,260,690 A | 11/1993 | Mann et al. | |
| 5,323,327 A | 6/1994 | Carmichael et al. | |
| 5,450,385 A | 9/1995 | Ellis et al. | |
| 5,455,409 A | * 10/1995 | Smith et al. ................. 235/385 |
| 5,767,532 A | * 6/1998 | Nishiguchi et al. ........... 257/80 |
| 5,814,171 A | 9/1998 | Manes et al. | |
| 5,870,732 A | 2/1999 | Fisher et al. | |
| 6,142,375 A | 11/2000 | Belka et al. | |
| 6,462,670 B1 | * 10/2002 | Bolognia et al. ...... 340/815.45 |

FOREIGN PATENT DOCUMENTS

| JP | 9091930 A | 4/1997 |
|---|---|---|
| JP | 11-073709 | 3/1999 |

* cited by examiner

Primary Examiner—Toan N Pham
(74) Attorney, Agent, or Firm—Law Offices of Michael Dryja

(57) ABSTRACT

Identifying the mounting locations of sub-systems in mounting units, such as rack cabinets, is disclosed. A mounting unit has a number of sub-system mounting locations. Each of one or more sub-systems is mounted in a corresponding sub-system mounting location of the cabinet. Each of one or more active indicators has an indicator mounting position on either the mounting unit or one of the sub-systems. Each of one or more sensors has a sensor mounting position similarly on either the mounting unit or one of the sub-systems, and also detects indication from a corresponding active indicator. The active indicators and the sensors cooperatively function to identify the corresponding sub-system mounting location of each sub-system in the mounting unit.

20 Claims, 4 Drawing Sheets

IDENTIFICATION OF MOUNTING LOCATIONS OF SUB-SYSTEMS IN MOUNTING UNITS

BACKGROUND OF THE INVENTION

1. Technical Field

This invention relates generally to mounting units, such as rack cabinets in which rack sub-systems are mounted, and more particularly to identifying the mounting locations of such rack sub-systems in such mounting units.

2. Description of the Prior Art

Many organizations have found the need to have a large number of computers. Even small businesses may have a handful of servers to run their internal operations, whereas large businesses may literally have hundreds or thousands of servers running in their data centers. In such instances, the typical mini-tower or desktop form factor of computers would occupy large amounts of expensive space. Therefore, organizations typically employ rack cabinets to hold these types of computers.

A rack cabinet can be generally defined as a frame or a cabinet into which computers and their components and peripherals are mounted. The computers and the components and peripherals, which may include file servers, network switches and hubs, and so on, are generally referred to as rack sub-systems. Furthermore, the term sub-system is more generally referred to as any type of module or other entity that can be mounted in a mounting unit, such as a rack cabinet. Most rack cabinets have a standard width of nineteen or twenty-three inches. Rack sub-systems are bolted to the frames of the rack cabinets, or slide onto shelves of the cabinets.

A given rack cabinet has a specific height that determines the number of rack sub-systems that can be mounted into the cabinet. Rack sub-systems come in varying heights, usually indicated as a multiple or a fraction of a standard rack unit (RU, or U) of 1.75 inches. A 2U rack sub-system, for example, occupies 3.5 inches of the height of a rack cabinet, whereas a half-U rack sub-system occupies 0.875 inches of the cabinet's height. Typical rack cabinets may range from a few feet in height, to as high as eight or more feet in height.

For large organizations having data centers in which thousands of rack sub-systems may be mounted in tens or hundreds of rack cabinets, a problem can develop in determining which components are mounted in which cabinets, and which cabinets have space available for mounting additional sub-systems. This problem is complicated by the fact that management of the rack sub-systems is typically accomplished remotely by information technology (IT) administrators, in a different room of the same building in which the data center is located, in a different building in the same location as the data center, or in a completely different location. Therefore, it is not always convenient or practical for the IT administrators to visit the data center to conduct inventory.

The usual solution is for a manual accounting of the data center to be performed on a periodic basis. The IT administrators may employ a hand-drawn map, for instance, and make a note of which sub-systems occupy which rack cabinets. This process is time-consuming and costly, however, as well as being prone to error. Furthermore, the sub-systems that occupy the rack cabinets may change over time, as sub-systems are removed, and new sub-systems are added. This can also impact the accuracy of the accounting of the data center.

For these described reasons, as well as other reasons, there is a need for the present invention.

SUMMARY OF THE INVENTION

The invention relates to identifying the mounting locations of sub-systems in mounting units. A system of the invention includes a mounting unit, one or more sub-systems, one or more active indicators, and one or more sensors. The mounting unit has a number of sub-system mounting locations. Each sub-system is mounted in a corresponding sub-system mounting location of the mounting unit. Each active indicator has an indicator mounting position on either the mounting unit or one of the sub-systems. Each sensor has a sensor mounting position similarly on either the mounting unit or one of the sub-systems, and also detects indication from a corresponding active indicator. The active indicators and the sensors cooperatively function to identify the corresponding sub-system mounting location of each sub-system in the mounting unit.

A method of the invention includes indicating by an active indicator mounted on a sub-system mounted in a sub-system mounting location of a mounting unit. A sensor mounted on the mounting unit and associated with the sub-system mounting location of the mounting unit detects the indication by the active indicator. The sub-system is then associated with the sub-system mounting location, based on the sensor detecting the indication by the active indicator.

An article of manufacture of the invention includes a computer-readable medium and means in the medium. The means is for indicating by an active indicator of an active indicator-sensor pair mounted to a mounting unit for reflection by a reflector mounted on a sub-system mounted in a sub-system mounting location of the mounting unit opposite to the active indicator-sensor pair. The means is further for detecting by a sensor of the active indicator-sensor pair the reflection to associate the sub-system with the sub-system mounting location of the mounting unit.

Other features and advantages of the invention will become apparent from the following detailed description of the presently preferred embodiment of the invention, taken in conjunction with the accompanying drawings.

DESCRIPTION OF THE PREFERRED EMBODIMENT

Overview

Figure 1:
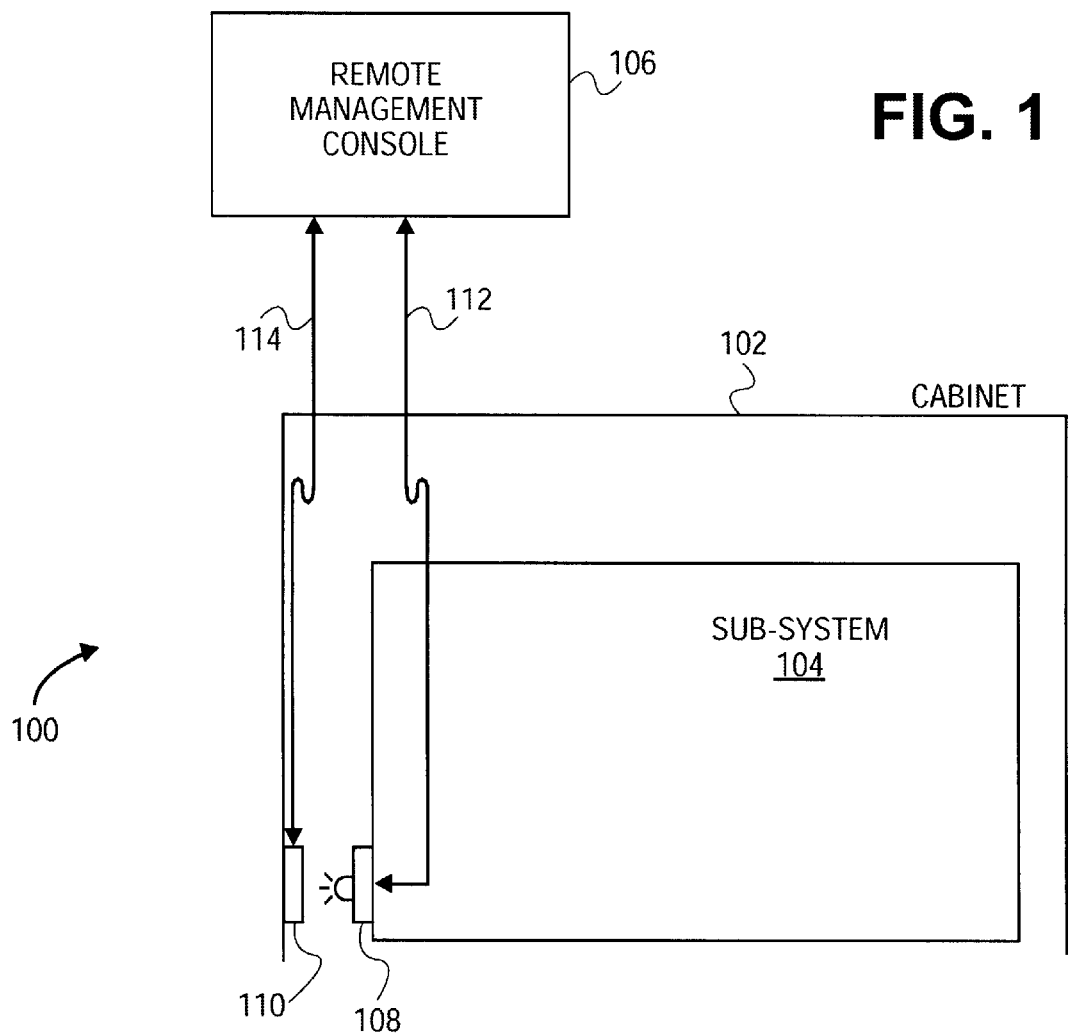
FIG. 1 is a diagram of the top view of a system according to a preferred embodiment of the invention in which the mounting location of a rack sub-system within a rack cabinet is identified, and is suggested for printing on the first page of the patent. The system shows a single active indicator and a single sensor, although embodiments of the invention encompass systems having multiple indicators and multiple sensors as well.

FIG. 1 shows the top view of a system 100 according to a preferred embodiment of the invention. The system 100 includes a rack cabinet 102, a rack sub-system 104 mounted within the rack cabinet 102 at a given mounting location, and a remote management console 106. The rack sub-system 104 may be a computer, a computer peripheral, or another type of component. It may be mounted within the rack cabinet 102 by being bolted into the cabinet 102, by being slid onto a shelf of the cabinet 102, or by another mounting approach.

The cabinet 102 includes a sensor 110, whereas the sub-system 104 includes an indicator 108. The indicator 108 may be an optical indicator, such as a light-emitting diode (LED). The sensor 110 may be an optical detector, such as a reflective opto-transducer. The remote management console 106 is preferably communicatively coupled to both the cabinet 102 and the sub-system 104, as indicated by the lines 114 and 112, respectively. The remote management console 106 may be a computer running in a different room at the same location in which the cabinet 102 is located, in a completely different location as compared to the cabinet 102, and so on.

The console 106 instructs the sub-system 104 to turn on its indicator 108. The sub-system 104 preferably includes a control logic that can receive this instruction to turn on the indicator 108, as well as an identifier that it can report back to the console 106. The identifier can then be looked up by the console 106 to determine the identity of the sub-system 104, as well as other information regarding the sub-system 104, such as its height, and so on.

The sensor 110 detects the indication of the indicator 108, and reports back this indication to the remote management console 106. The sensor 110 also preferably includes a control logic that can report the indication back to the console 106, and an identifier that it can report to the console 106. The identifier of the sensor 110 can be looked up by the console 106 to determine its identity, as well as other information, such as the mounting location within the rack cabinet 102 with which the sensor 110 is associated.

Upon receiving the detected indication from the sensor 110, the remote management console 106 is able to associate the sub-system 104 with the mounting location within the cabinet 102 associated with the sensor 110. In this way, the preferred embodiment of the invention of FIG. 1 identifies the mounting location of the sub-system 104 within the cabinet 102. Because the indicator 108 preferably reports an identifier to the console 106, the console 106 is also able to determine the height of the cabinet 102 occupied by the sub-system 104. Furthermore, where height information regarding the sub-system 104 is available to the console 106, only one indicator 108 is needed for the sub-system 104. If height information is unavailable, then one indicator 108 may be needed for each base unit of height—i.e., each unit (U) of 1.75 inches—of the sub-system 104.

Technical Background

Figure 2:
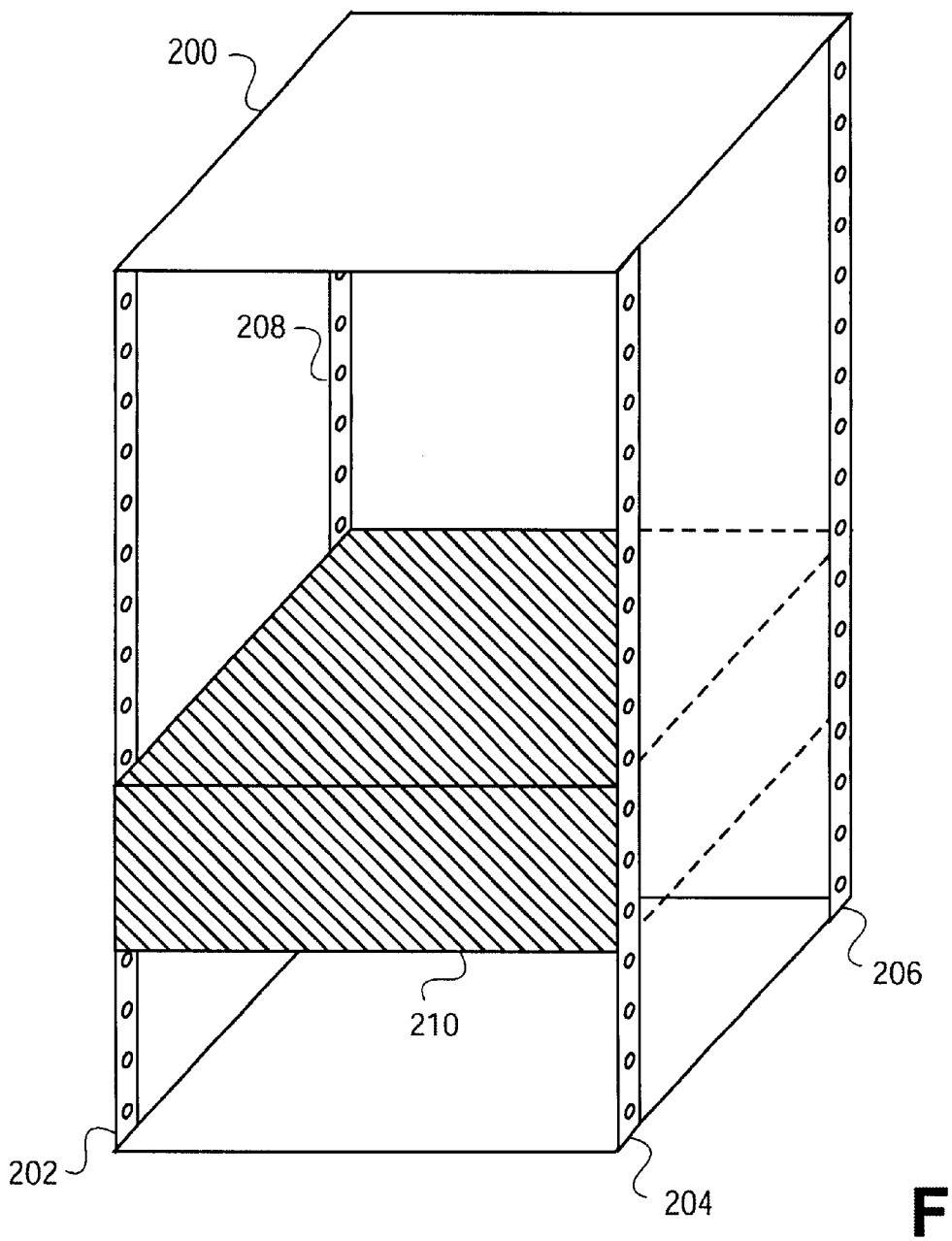
FIG. 2 is a diagram of the perspective view of an example rack cabinet having a rack sub-system mounted therein, in conjunction with which embodiments of the invention can be implemented. Whereas the example rack cabinet shows only a single rack sub-system mounted therein, embodiments of the invention are applicable to the situation where more than one rack sub-system is mounted in a cabinet as well.

FIG. 2 shows an example rack cabinet 200 in conjunction with which embodiments of the invention can be implemented. The rack cabinet 200 is only one type of mounting unit in conjunction with which embodiments of the invention can be implemented. The rack cabinet 200 has vertical rails 202, 204, 206, and 208 at its corners, in which mounting holes are present for bolting rack sub-systems within the rack cabinet 200. In FIG. 2, a single rack sub-system 210 has been bolted to a particular mounting location within the rack cabinet 200. Other rack sub-systems may be mounted within the rack cabinet 200 above and below the sub-system 210. Such sub-systems may be mounted by bolting, similar to the sub-system 210, or shelves may be added to the cabinet 200, and the sub-systems placed on the shelves. Other mounting approaches are also amenable to the invention.

Method for Identifying Locations of Sub-Systems in Cabinet

Figure 3:
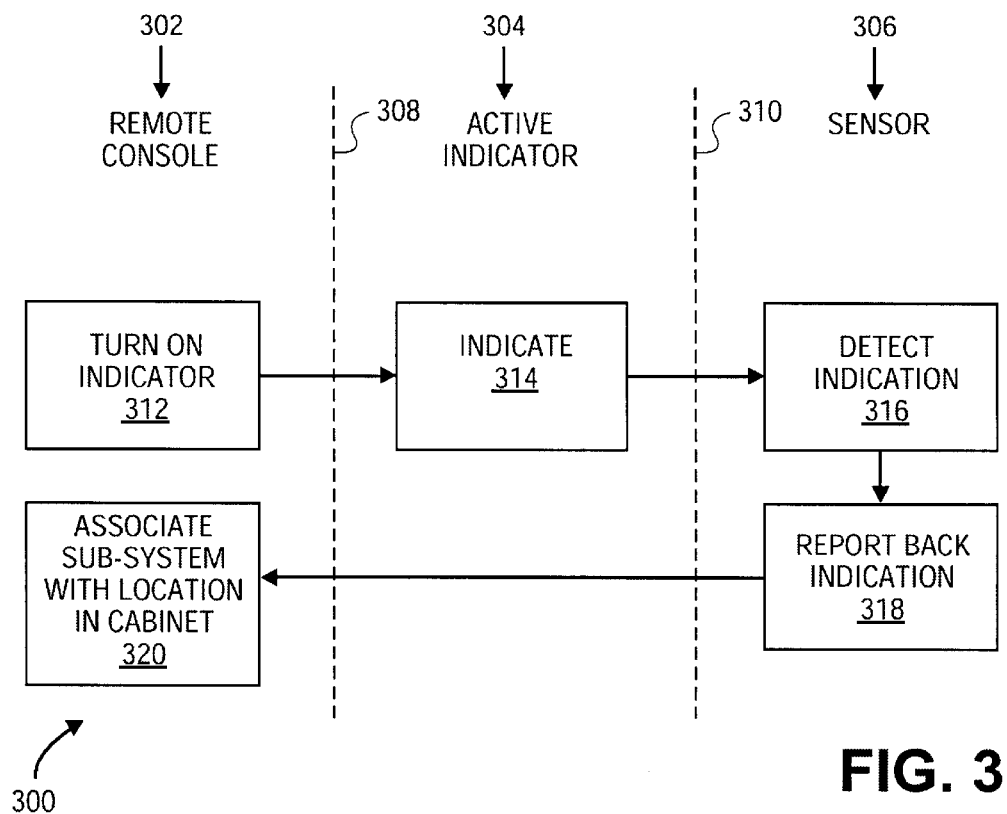
FIG. 3 is a flowchart of a method for identifying the mounting locations of rack sub-systems within a rack cabinet, according to an embodiment of the invention.

FIG. 3 shows an exemplary method 300 for identifying the mounting location of a rack sub-system within a rack cabinet, according to an embodiment of the invention. Parts of the method 300 are performed by a remote management console, an active indicator, and a sensor, as indicated by the columns 302, 304, and 306, respectively, as separated by the dotted lines 308 and 310. The method 300 can be implemented as means stored on a computer-readable medium of an article of manufacture. For instance, the medium may be a recordable data storage medium, a modulated carrier signal, or another type of medium. The method 300 can also be implemented in conjunction with systems of the invention described herein, such as the system 100 of FIG. 1.

The active indicator and the sensor may each be mounted either on the rack cabinet or the rack sub-system. That is, unlike the preferred embodiment in which the active indicator is mounted on the rack sub-system and the sensor is mounted on the rack cabinet, more generally either or both of the active indicator and the sensor may be mounted on the sub-system or the cabinet. For example, the sensor may be mounted on the sub-system and the indicator may be mounted on the cabinet. As another example, both the sensor and the indicator may be mounted on the cabinet, where a reflective strip is mounted on the sub-system, for reflecting indication by the indicator back to the sensor.

Furthermore, the mounting positions of the active indicator and the sensor may be integrated mounting positions, or surface mounting positions. An integrated mounting position is one in which the indicator or the sensor is integral to the cabinet or the sub-system, where, for instance, the cabinet or the sub-system is designed a priori to include the indicator or the sensor. A surface mounting position is one in which the indicator or the sensor is mounted to the surface of the cabinet or the sub-system, where, for instance, the cabinet or the sub-system is not designed a priori to include the indicator or the sensor.

The method 300 assumes that both the active indicator and the sensor are communicatively coupled to and remotely controllable by the remote management console. However, this assumption is not true in all embodiments of the invention, and is not required for successful implementation of the invention. In the method 300, though, the remote console first instructs the active indicator to turn on (312). In response to receiving this instruction or command from remote console, the active indicator provides its indication (314), which is detected by the sensor (316). Detection by the sensor may be enabled by its being mounted opposite to the indicator. Alternatively, detection of the sensor may be enabled by its being mounted on substantially the same plane as the indicator, as an indicator-sensor pair, where a reflector opposite the indicator reflects indication from the indicator to the sensor.

Once having detected indication from the indicator, the sensor reports back this indication to the remote console (318). The console then remotely associates the sub-system in question with the mounting location of the cabinet in question (320). For example, the indicator may be mounted on the sub-system, where the detector is mounted on the cabinet. The remote console preferably has knowledge that the indicator is associated with this sub-system, and also preferably has knowledge that the detector is associated with a given mounting location of the cabinet. Therefore, by instructing the indicator to turn on, and then receiving back from the sensor that it detected indication from the indicator, the remote console is able to conclude that the sub-system is mounted in the mounting location of the cabinet associated with the sensor.

Alternative Embodiment: Indication Pattern

Figure 4:
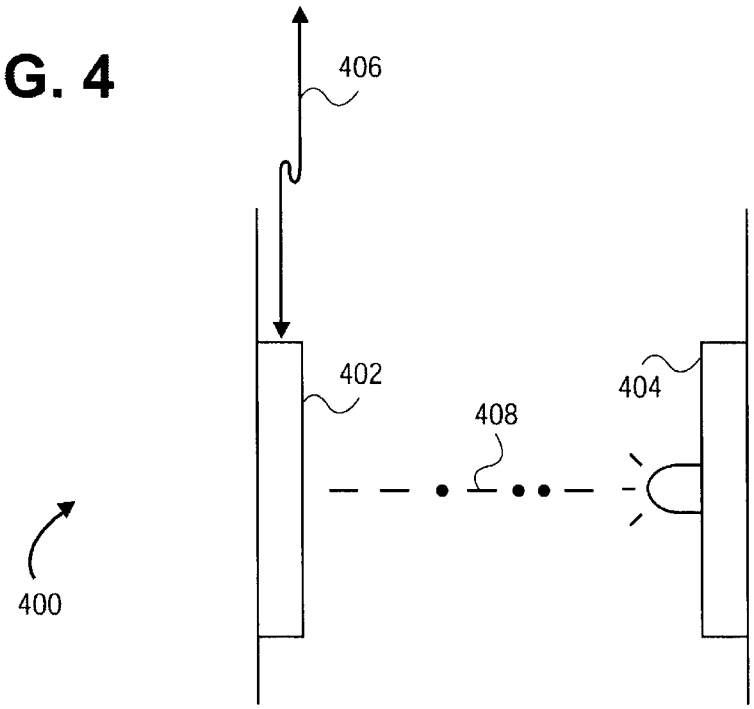
FIG. 4 is a diagram of a side or top view of a system according to an alternative embodiment of the invention, in which an indicator indicates according to a pattern for detection by a sensor for identifying the mounting location of a rack sub-system within a rack cabinet.

FIG. 4 shows a system 400 according to an alternative embodiment of the invention that allows for the situation where the rack cabinet or the rack sub-system to which the active indicator is mounted is not communicatively coupled to nor remotely controllable by the remote management console. The system 400 includes a sensor 402 and an active indicator 404. Whereas the sensor 402 is communicatively coupled to the remote management console, as indicated by the line 406, the active indicator 404 is not. The remote management console thus cannot instruct the indicator 404 to turn on, nor can it receive an identifier of and other information regarding the sub-system or the cabinet to which the indicator 404 is mounted.

Therefore, the indicator 404 provides indication for detection by the sensor 402 according to a pattern, as indicated by the series of dots and dashes 408. For example, where the indicator 404 is an optical indicator such as a light-emitting diode (LED), the indicator 404 may turn on and off according to a pattern. The pattern may thus indicate the identifier of and the other information regarding the sub-system or the cabinet to which the indicator 404 is mounted, and which would otherwise be sent directly to the remote management console 406. The indication pattern, upon detection by the sensor 402, can thus still be sent to the remote management console. The console may look up the pattern detected by the sensor 402 to identify the sub-system or the cabinet to which the indicator 404 is mounted, and so on.

Alternative Embodiment: Surface-Mounted Indicator or Sensor

Figure 5:
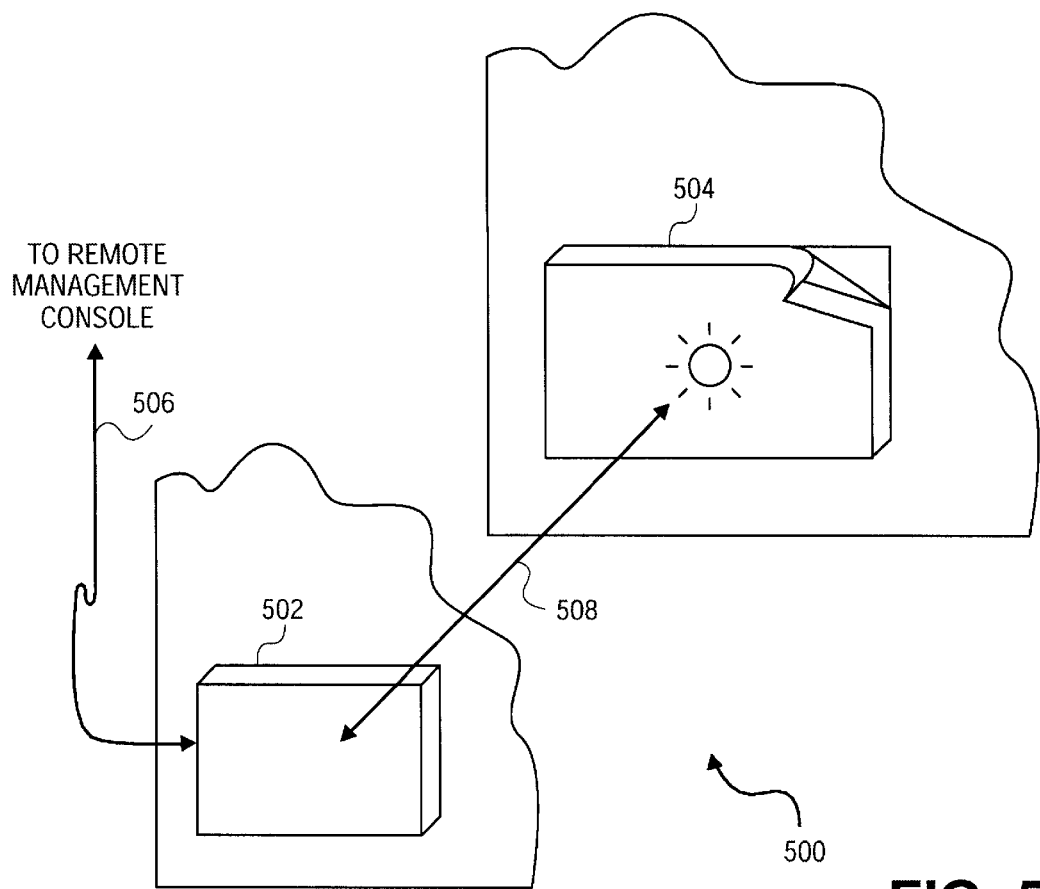
FIG. 5 is a diagram of a perspective view of a system according to another alternative embodiment of the invention, in which indication from a stick-on indicator is detected by a sensor for identifying the mounting location of a rack sub-system within a rack cabinet.

FIG. 5 shows a system 500 according to an alternative embodiment of the invention that allows for the situation where the rack cabinet or the rack sub-system are not designed for integrated mounting of an indicator, such that a surface-mounted active indicator is instead used. Whereas the system 500 specifically shows a surface-mounted active indicator, the invention is more generally applicable to a surface-mounted sensor as well. The system 500 includes a sensor 502 and an active indicator 504.

The active indicator 504 is specifically shown in FIG. 5 as being a surface-mounted, stick-on indicator. That is, the active indicator 504 is implemented as a low-profile circuit that can be stuck onto either the rack cabinet or the rack sub-system. As shown in FIG. 5, the active indicator 504 as so implemented is also not communicatively coupled to the remote management console, as compared to the sensor 502, which is communicatively coupled to the remote management console, as indicated by the line 506. This is not necessarily the case for implementation of a surface-mount and/or stick-on indicator as the active indicator 504, however.

Where the active indicator 504 is not communicatively coupled to the remote console, the console thus cannot instruct the indicator 504 to turn on, nor can it receive an identifier of and other information regarding the sub-system or the cabinet to which the indicator 504 is mounted. In this sense, the embodiment of FIG. 5 is similar to the embodiment of FIG. 4, and the indication pattern used in the embodiment of FIG. 4 may be used in the embodiment of FIG. 5 as well. More generally, the indicator provides an indication that is detected by the sensor 502, as indicated by the line 508.

The active indicator 504 in the embodiment of FIG. 5 may have an integrated power source, such as a battery, that has a potentially short lifetime. Therefore, the sensor 502 in this case may have a manner by which to indicate to the active indicator 504 that it should turn on. For instance, a light-emitting diode (LED) in the sensor 502 may turn on, detection of which by the active indicator 504 causing the active indicator 504 to itself turn on and indicate for a brief period of time to the sensor 502. In addition, the active indicator 504 may be a controllable reflector, such as a reflective liquid-crystal display (LCD), to reduce power usage, in the case where the sensor 502 has an LED, such as where the sensor 502 is a reflective opto-transducer.

Alternative Embodiment: Sensor and Indicator Both Mounted to Same Component

Figure 6:
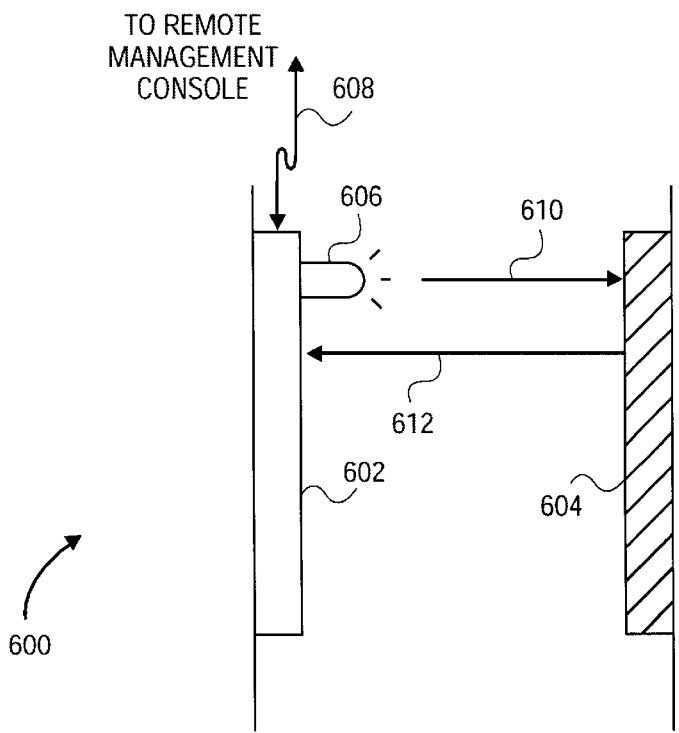
FIG. 6 is a diagram of a side or top view of a system according to still another alternative embodiment of the invention, in which indication from an indicator is reflected by a reflector and then detected by a sensor for identifying the mounting location of a rack sub-system within a rack cabinet.

FIG. 6 shows a system 600 according to an alternative embodiment of the invention where both the active indicator and the sensor are both mounted, as an active-indicator-sensor pair, to either the rack sub-system or the rack cabinet. This may be desirable where only one of the sub-system and the cabinet allows for easy mounting of the indicator and the sensor, and a surface-mounted, stick-on sensor or active indicator, as described in conjunction with the embodiment of FIG. 5, is not desired. The system 600 includes a sensor 602 and an active indicator 606, as well as reflector 604, such as a reflective strip that sticks onto the surface of the sub-system or the cabinet.

Therefore, when the remote management console instructs the active indicator 606 to turn on, where both the indicator 606 and the detector 602 are communicatively coupled to the console as indicated by the line 608, the indicator 606 emits indication as indicated by the line 610. The reflector 604 reflects this indication back to the sensor 602, as indicated by the line 612, so that the sensor 602 can detect the indication from the indicator 606. This information, once reported back to the remote management console, can be used by the console to conclude, for example, that the mounting location within the rack cabinet at which the indicator 606 and the detector 602 are mounted is occupied by a sub-system. Where the indicator 606 provides indication that is not subsequently detected by the detector 602, then the console may conversely conclude that the mounting location is not occupied by a sub-system.

Advantages over the Prior Art

Embodiments of the invention allow for advantages over the prior art. The mounting locations of rack sub-systems within rack cabinets can be remotely discerned by employing embodiments of the invention. An information technology (IT) administrator thus does not have to employ manual ways to take inventory of a data center. This saves time and money, and also ensures that the accuracy of the inventory is not compromised, as may result from using a manual approach. In addition, significant value is provided in directing the actions of IT and other personnel involved in installing, reconfiguring, and servicing sub-systems within cabinets. Some embodiments further allow for existing rack cabinets and sub-systems to be retrofitted with active indicators and sensors, by the use of surface-mount and/or stick-on indicators and sensors. Other embodiments allow for a priori integration with rack cabinets and rack sub-systems.

Other Alternative Embodiments

It will be appreciated that, although specific embodiments of the invention have been described herein for purposes of illustration, various modifications may be made without departing from the spirit and scope of the invention. For instance, whereas the invention has been substantially described in relation to a sensor mounted on a rack cabinet and an active indicator mounted on a rack sub-system, the invention is not limited to this scenario. The sensor may be mounted to the sub-system, for instance, and the indicator to the cabinet. As another example, whereas the invention has been substantially described in relation to a single rack sub-system mounted within a single rack cabinet, this is for purposes of descriptive clarity only. The invention is more generally applicable to any number of rack sub-systems mounted within any number of rack cabinets. Accordingly, the scope of protection of this invention is limited only by the following claims and their equivalents.

What is claimed is:

1. A system comprising:
   a mounting unit having a plurality of sub-system mounting locations;
   one or more sub-systems, each sub-system mounted in a corresponding sub-system mounting location of the mounting unit;
   one or more active indicators, each active indicator having an indicator mounting position on one of the mounting unit and the one or more sub-systems; and,
   one or more sensors, each sensor having a sensor mounting position on one of the mounting unit and the one or more sub-systems, such that each sensor detects indication from a corresponding active indicator,
   the one or more active indicators and the one or more sensors cooperatively functioning to identify the corresponding sub-system mounting location of each sub-system in the mounting unit.

2. The system of claim 1, wherein the indicator mounting position of each active indicator is on a corresponding sub-system, and the sensor mounting position of each sensor is on the mounting unit.

3. The system of claim 1, wherein the indicator mounting position of each active indicator and the sensor mounting position of each sensor is on the mounting unit such that the one or more active indicators and the one or more sensors are organized on the mounting unit as a plurality of active indicator-sensor pairs, the system further comprising one or more reflectors, each reflector mounted on a corresponding sub-system opposite a corresponding active indicator-sensor pair of the mounting unit and reflecting indication from the active indicator of the corresponding pair to the sensor of the corresponding pair.

4. The system of claim 1, where the indicator mounting position of each active indicator is on the mounting unit, and the sensor mounting position of each sensor is on a corresponding sub-system.

5. The system of claim 1, wherein each of the one or more active indicators comprises an optical indicator, and each of the one or more sensors comprises a reflective opto-transducer.

6. The system of claim 1, wherein the indicator mounting position of each active indicator and each sensor is one of a surface mounting position and an integrated mounting position.

7. The system of claim 1, further comprising a management console, wherein each active indicator is remotely controllable from the management console.

8. The system of claim 1, further comprising a management console, wherein each sensor is communicatively coupled to the management console.

9. The system of claim 1, wherein each active indicator provides indication upon command from one of the management console and the sensor to which the active indicator corresponds.

10. The system of claim 1, wherein each active indicator provides indication upon command.

11. The system of claim 1, wherein each active indicator provides indication according to a pattern to indicate identifying information.

12. The system of claim 1, wherein each active indicator comprises a controllable reflector.

13. The system of claim 1, wherein the mounting unit comprises a rack cabinet.

14. A method comprising:
   indicating by an active indicator mounted on a sub-system mounted in a sub-system mounting location of a mounting unit;
   detecting by a sensor mounted on the mounting, unit and associated with the sub-system mounting location of the mounting unit of indication by the active indicator; and,
   associating the sub-system with the sub-system mounting location based on the sensor detecting the indication by the active indicator.

15. The method of claim 14, further initially comprising remotely instructing the active indicator to provide indication through a management console communicatively coupled to the active indicator.

16. The method of claim 14, wherein indicating by the active indicator comprises providing indication according to a pattern to provide identifying information regarding the sub-system.

17. The method of claim 14, wherein associating the sub-system with the sub-system mounting location comprises remotely associating the sub-system with the sub-system mounting location communicatively coupled to the active indicator.

18. An article comprising:
   a computer-readable medium; and,
   means in the medium for indicating by an active indicator of an active indicator-sensor pair mounted to a mounting unit for reflection by a reflector mounted on a sub-system mounted in a sub-system mounting location of the mounting unit opposite to the active indicator-sensor pair, and for detecting by a sensor of the active indicator-sensor pair the reflection to associate the sub-system with the sub-system mounting location of the mounting unit.

19. The article of claim 18, wherein the means is further for receiving instruction to provide indication by the active indicator from a remote management console, and for sending information regarding association of the sub-system with the sub-system mounting location to the remote management console.

20. The article of claim 18, wherein the medium is one of a modulated carrier signal and a recordable data storage medium.

* * * * *